(12) United States Patent
Oishi et al.

(10) Patent No.: US 12,444,872 B2
(45) Date of Patent: Oct. 14, 2025

(54) JOINT CONNECTOR AND METHOD FOR MANUFACTURING JOINT CONNECTOR

(71) Applicant: Yazaki Corporation, Tokyo (JP)

(72) Inventors: Kozo Oishi, Makinohara (JP); Tomoyoshi Fukaya, Makinohara (JP); Jun Ishikawa, Tokyo (JP)

(73) Assignee: Yazaki Corporation, Tokyo (JP)

( * ) Notice: Subject to any disclaimer, the term of this patent is extended or adjusted under 35 U.S.C. 154(b) by 357 days.

(21) Appl. No.: 18/351,825

(22) Filed: Jul. 13, 2023

(65) Prior Publication Data

US 2024/0063569 A1 Feb. 22, 2024

(30) Foreign Application Priority Data

Aug. 17, 2022 (JP) ................................ 2022-130187

(51) Int. Cl.
*H01R 13/405* (2006.01)
*H01R 43/18* (2006.01)

(52) U.S. Cl.
CPC ........... *H01R 13/405* (2013.01); *H01R 43/18* (2013.01); *H01R 2201/26* (2013.01)

(58) Field of Classification Search
CPC ... H01R 13/405; H01R 43/18; H01R 2201/26
USPC .................................................. 439/736, 511
See application file for complete search history.

(56) References Cited

U.S. PATENT DOCUMENTS

| | | | | |
|---|---|---|---|---|
| 5,463,270 A | * | 10/1995 | Wakimizu | H01J 61/34 313/318.09 |
| 6,193,549 B1 | * | 2/2001 | Suzuki | H01R 13/4223 439/511 |
| 7,335,054 B2 | * | 2/2008 | Nakazawa | H01R 31/08 439/511 |
| 7,488,904 B2 | * | 2/2009 | Maegawa | B29C 45/1671 174/68.2 |
| 9,716,363 B2 | | 7/2017 | Saitoh | |
| 11,153,974 B2 | * | 10/2021 | Muronoi | H05K 5/0034 |
| 11,411,343 B2 | * | 8/2022 | Asano | H05K 3/284 |
| 2015/0099396 A1 | * | 4/2015 | Mori | H01R 13/405 439/606 |
| 2016/0322719 A1 | | 11/2016 | Saitoh | |
| 2020/0315027 A1 | * | 10/2020 | Muronoi | H05K 5/064 |

FOREIGN PATENT DOCUMENTS

JP 2016-212982 A 12/2016

* cited by examiner

*Primary Examiner* — Gary F Paumen
(74) *Attorney, Agent, or Firm* — Banner & Witcoff, Ltd.

(57) ABSTRACT

There is provided a joint connector including: a ground terminal member made of a conductive metal, and configured by integrally forming a plate-shaped fixing portion fixed to a ground portion, the body horizontal plate portion extending from the plate-shaped fixing portion, the body rising plate portion formed by bending the body horizontal plate portion in a rising direction at a bent portion, the terminal connection portion provided above the body rising plate portion, and the crank-shaped bent portion bent in a crank shape near the terminal connection portion in the body rising plate portion; a housing to which the ground terminal member is insert-molded; and a primer treatment portion applied to an outer peripheral surface of the body rising plate portion on a side of the body horizontal plate portion with respect to the crank-shaped bent portion.

2 Claims, 9 Drawing Sheets

FIG.1
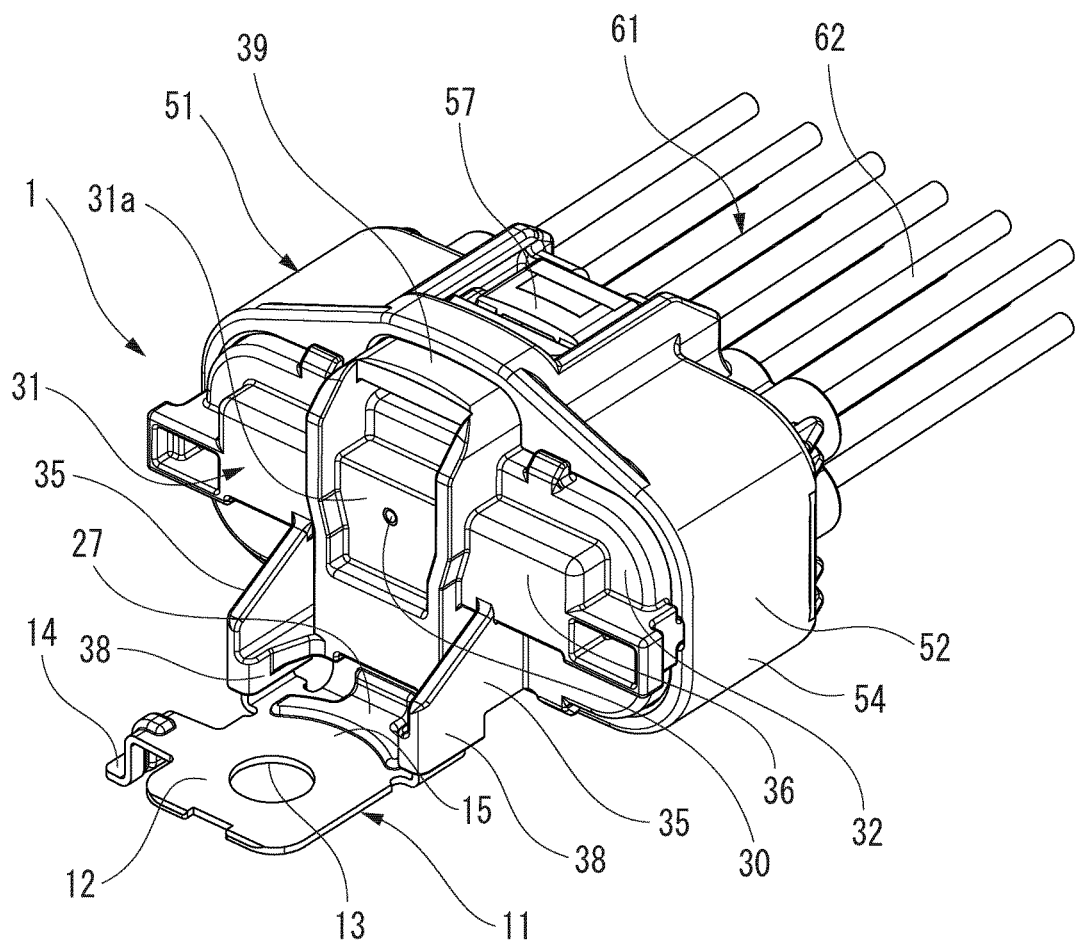
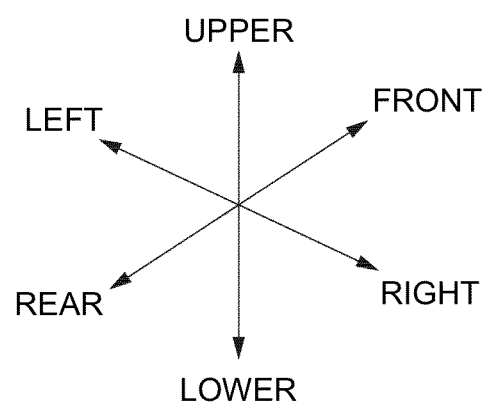

JOINT CONNECTOR AND METHOD FOR MANUFACTURING JOINT CONNECTOR

CROSS-REFERENCE TO RELATED APPLICATIONS

This application is based on and claims priority under 35 USC 119 from Japanese Patent Application No. 2022-130187 filed on Aug. 17, 2022, the contents of which are incorporated herein by reference.

TECHNICAL FIELD

The present disclosure relates to a joint connector and a method for manufacturing a joint connector.

BACKGROUND ART

A known joint connector for collectively connecting a plurality of electric wires to a ground portion of a vehicle includes: a connection member (ground terminal member) having a fixing plate portion (plate-shaped fixing portion) which is fixed to a body (ground portion) of the vehicle by screws, and a base portion (terminal connection portion) at one end of the fixing plate portion in which a plurality of tab portions (terminal connecting portions) to which terminals of a counterpart connector (counterpart terminals) are electrically connected are formed; and a resin housing in which the connection member is insert-molded.

A joint connector including such a connection member is manufactured by injecting a molten resin into a mold with the connection member set in the mold to integrally mold the resin for molding the housing (for example, see JP2016-212982A).

In a state in which the joint connector is integrally molded, an outer peripheral surface of the base portion or the like of the connection member is in close contact with the resin of the housing. However, when the integral molding is performed, even if molding is performed under a predetermined molding condition, there is a possibility that the outer peripheral surface of the base portion or the like of the connection member and the resin of the housing are not in close contact with each other due to the influence of the outside air temperature or the like in some cases, and then a gap may be generated therebetween.

Therefore, when the joint connector as described above is used as a waterproof connector, there is a concern that water may enter the connector due to a gap generated between the outer peripheral surface of the base portion or the like of the connection member and the resin of the housing.

SUMMARY OF INVENTION

The present disclosure provides a joint connector capable of preventing water from entering the connector, and a method for manufacturing the joint connector.

According to an illustrative aspect of the present disclosure, a joint connector includes: a ground terminal member made of a conductive metal; a primer treatment portion formed by applying a primer onto the ground terminal member; and a housing to which the ground terminal member is insert-molded. The ground terminal member includes: a plate-shaped fixing portion that is fixed to a ground portion of a vehicle; a body horizontal plate portion that extends from the plate-shaped fixing portion; a body rising plate portion that is formed by bending the body horizontal plate portion in a rising direction at a bent portion; a terminal connection portion that is provided above the body rising plate portion and that is formed with a plurality of terminal connecting portions electrically connectable with a counterpart terminal; and a crank-shaped bent portion that is bent in a crank shape in a vicinity of the terminal connection portion in the body rising plate portion. The ground terminal member is configured by integrally forming the plate-shaped fixing portion, the body horizontal plate portion, the body rising plate portion, the terminal connection portion, and the crank-shaped bent portion. The housing has a gate mark formed by filling a molten resin on a surface of the housing on a side opposite to a direction in which the terminal connecting portions protrude. The primer treatment portion is applied to an outer peripheral surface of the body rising plate portion on a side of the body horizontal plate portion with respect to the crank-shaped bent portion.

According to another illustrative aspect of the present disclosure, a method for manufacturing the joint connector includes: holding the ground terminal member in a mold for molding the housing; and molding the housing by filling the mold with a molten resin from a gate disposed at a position facing the terminal connection portion in the mold.

The present disclosure is briefly described above. Further, the details of the present disclosure can be further clarified by reading the embodiments described below (hereinafter referred to as "embodiments") with reference to the accompanying drawings.

BRIEF DESCRIPTION OF DRAWINGS

FIG. 1 is a perspective view of a joint connector according to an embodiment of the present disclosure to which a counterpart connector is fitted;

DESCRIPTION OF EMBODIMENTS

A specific embodiment of the present disclosure will be described below with reference to the drawings.

Figure 2:
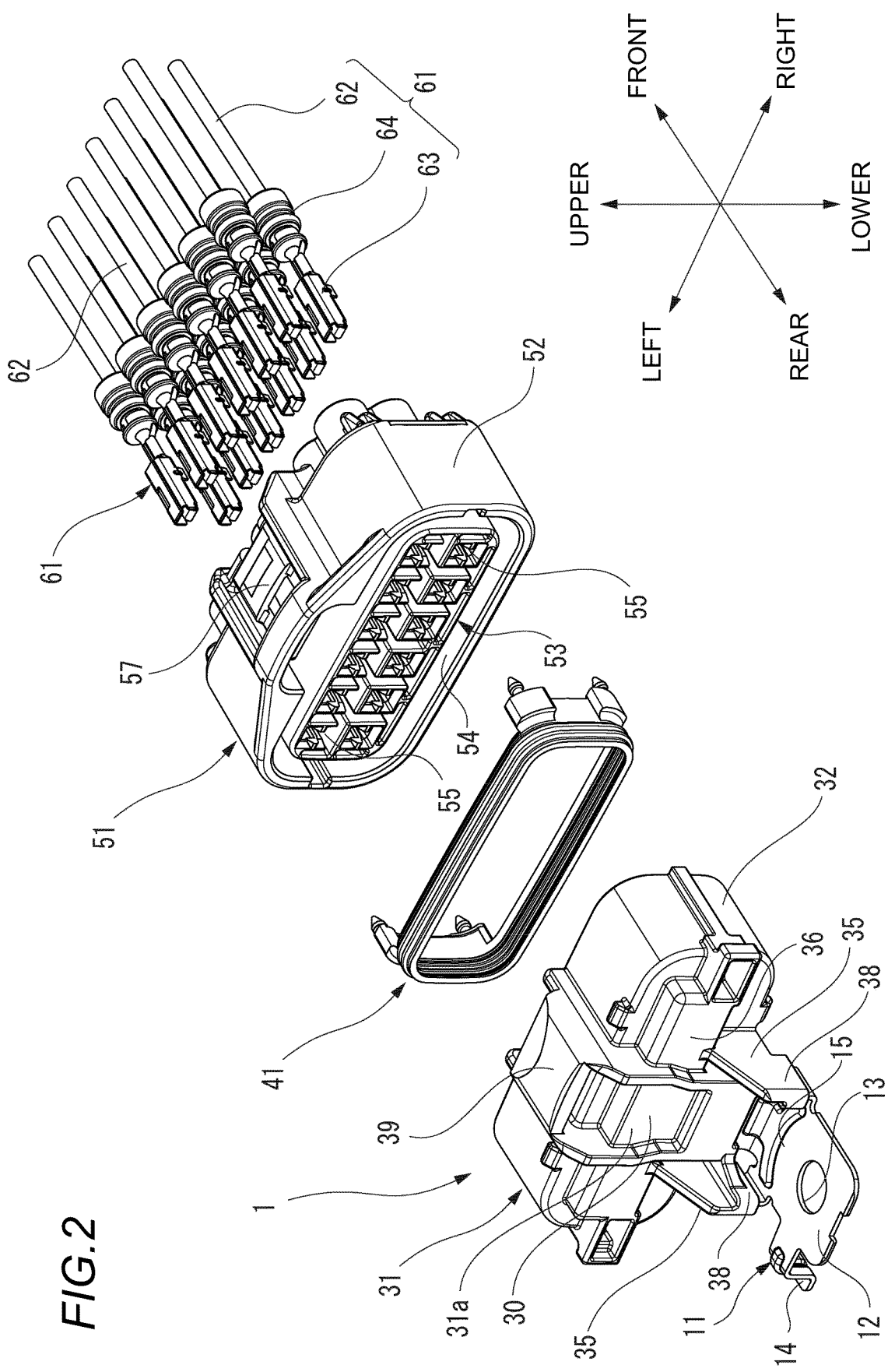
FIG. 2 is an exploded perspective view of the joint connector and the counterpart connector shown in FIG. 1.

FIG. 1 is a perspective view of a joint connector 1 according to an embodiment of the present disclosure to which a counterpart connector 51 is fitted. FIG. 2 is an exploded perspective view of the joint connector 1 and the counterpart connector 51 shown in FIG. 1.

Note that, in the present description, a front-rear direction, an upper-lower direction, and a left-right direction of the joint connector 1 follow directions of arrows shown in FIG. 1. That is, the front-rear direction is a direction along a connector fitting direction of the joint connector 1, and a side to which a counterpart housing 52 is fitted is defined as a front side of a housing 31. Further, the upper-lower direction is a lateral direction of the housing 31 orthogonal to the connector fitting direction of the flat rectangular parallelepiped joint connector 1, and a lock portion 39 side of the housing 31 is defined as an upper side. Further, the left-right direction is a longitudinal direction of the housing 31 orthogonal to the connector fitting direction of the joint connector 1.

As shown in FIGS. 1 and 2, the counterpart connector 51 is fitted to the joint connector 1 according to the present embodiment.

The joint connector 1 includes a ground terminal member 11 made of conductive metal, a primer treatment portion 29, and the housing 31 made of an insulating resin. The counterpart connector 51 includes terminal-attached electric wires 61, a counterpart housing 52 made of an insulating resin, and an annular packing 41.

Figure 3:
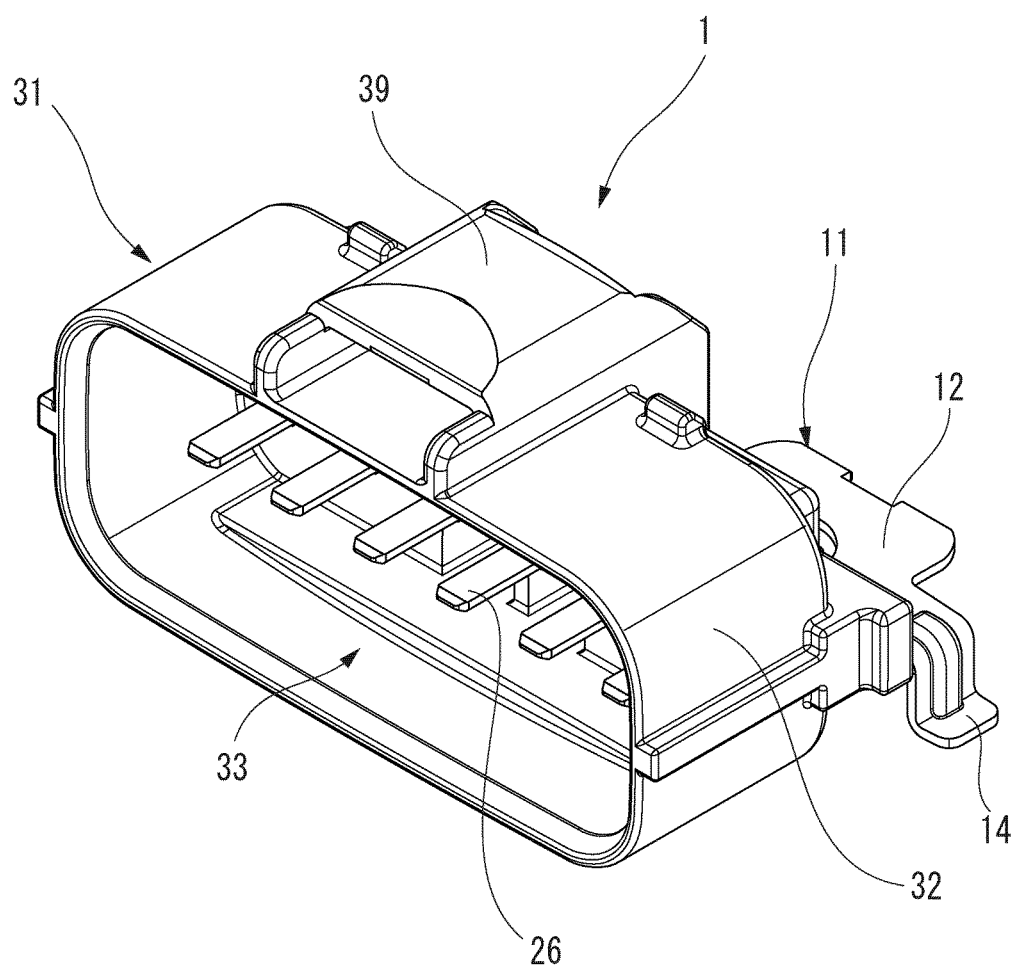
FIG. 3 is a perspective view of the joint connector shown in FIG. 2 as viewed from a front side.

A fitting recessed portion 33 is formed in the housing 31 so that a front end side, which is the front side in the fitting direction with the counterpart connector 51, is open (see FIG. 3). As shown in FIG. 2, a counterpart fitting portion 53 is formed on a front end side of the counterpart housing 52 to be fitted to the joint connector 1. The counterpart connector 51 is fitted to the joint connector 1 by fitting the counterpart fitting portion 53 of the counterpart housing 52 into the fitting recessed portion 33 of the housing 31.

As shown in FIG. 2, a plurality of terminal accommodating chambers 55 are formed in the counterpart fitting portion 53 of the counterpart housing 52. The terminal accommodating chambers 55 are formed along the fitting direction with the joint connector 1. The terminal accommodating chambers 55 are arranged in a left-right width direction of the counterpart housing 52, and are arranged in two stages in the upper-lower direction. The counterpart fitting portion 53 has lance portions (not shown) protruding into respective terminal accommodating chambers 55. A lock arm 57 is formed on an upper face of the counterpart housing 52.

The counterpart housing 52 has a hood portion 54 around the counterpart fitting portion 53, and an annular packing 41 is fitted into the hood portion 54. When the counterpart fitting portion 53 of the counterpart housing 52 is fitted into the fitting recessed portion 33 of the housing 31, the annular packing 41 stops water not to enter a part between the fitting recessed portion 33 and the counterpart fitting portion 53.

A counterpart terminal 63 of the terminal-attached electric wire 61 is accommodated in the terminal accommodating chamber 55 from a rear side of the counterpart housing 52. The counterpart terminal 63 is formed of, for example, a conductive metal material such as copper or a copper alloy, and is crimped and conductively connected to a terminal of an electric wire 62 in which periphery of a conductor is covered with an outer sheath.

The counterpart terminal 63 is locked to the lance portion by being inserted into the terminal accommodating chamber 55 from the rear side of the counterpart housing 52. As a result, the counterpart terminal 63 is held in a state of being accommodated in the terminal accommodating chamber 55.

A waterproof plug 64, which is a cylindrical packing, is fitted to a terminal of the electric wire 62. When the terminal of the electric wire 62 is inserted into the terminal accommodating chamber 55, the waterproof plug 64 comes into close contact with an inner peripheral face of the terminal accommodating chamber 55 to waterproof a space with the electric wire 62 in a watertight manner.

Figure 4:
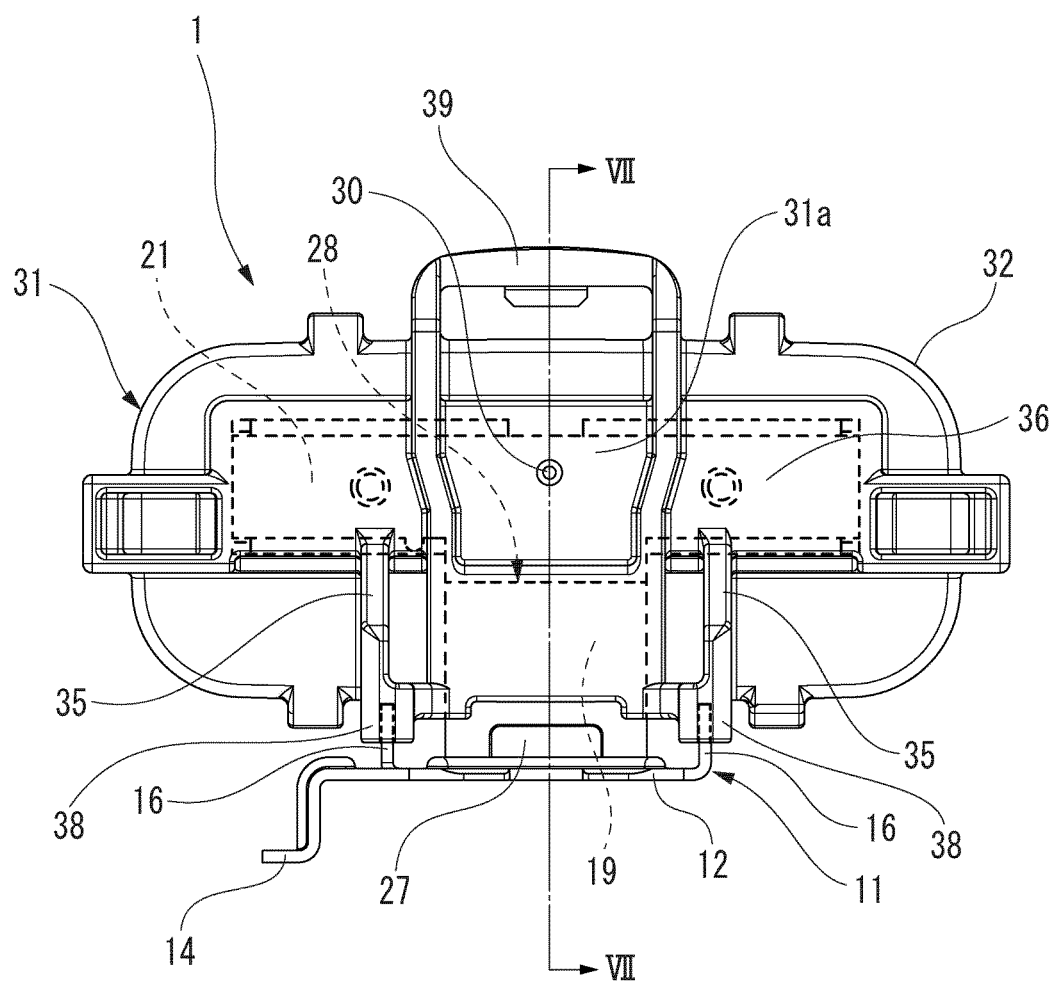
FIG. 4 is a rear view of the joint connector in which a ground terminal member is insert-molded in a housing.
Figure 5:
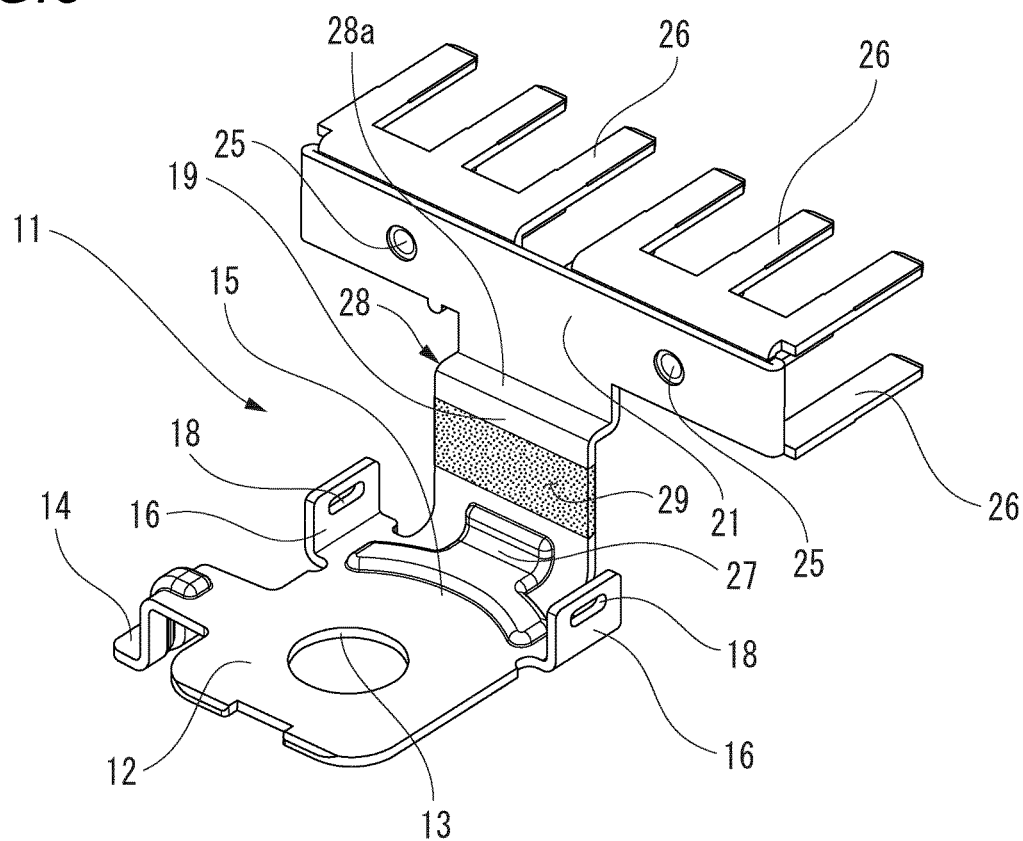
FIG. 5 is a perspective view of the ground terminal member as viewed from a rear upper side.
Figure 6:
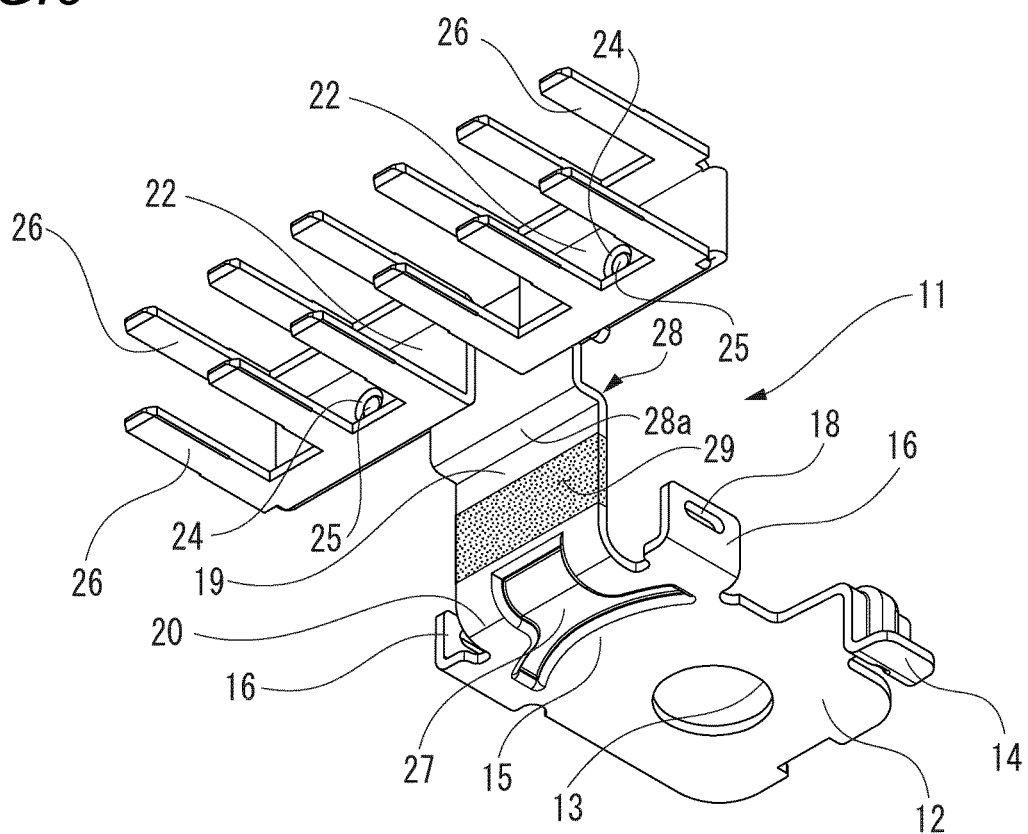
FIG. 6 is a perspective view of the ground terminal member as viewed from a front lower side.
Figure 7:
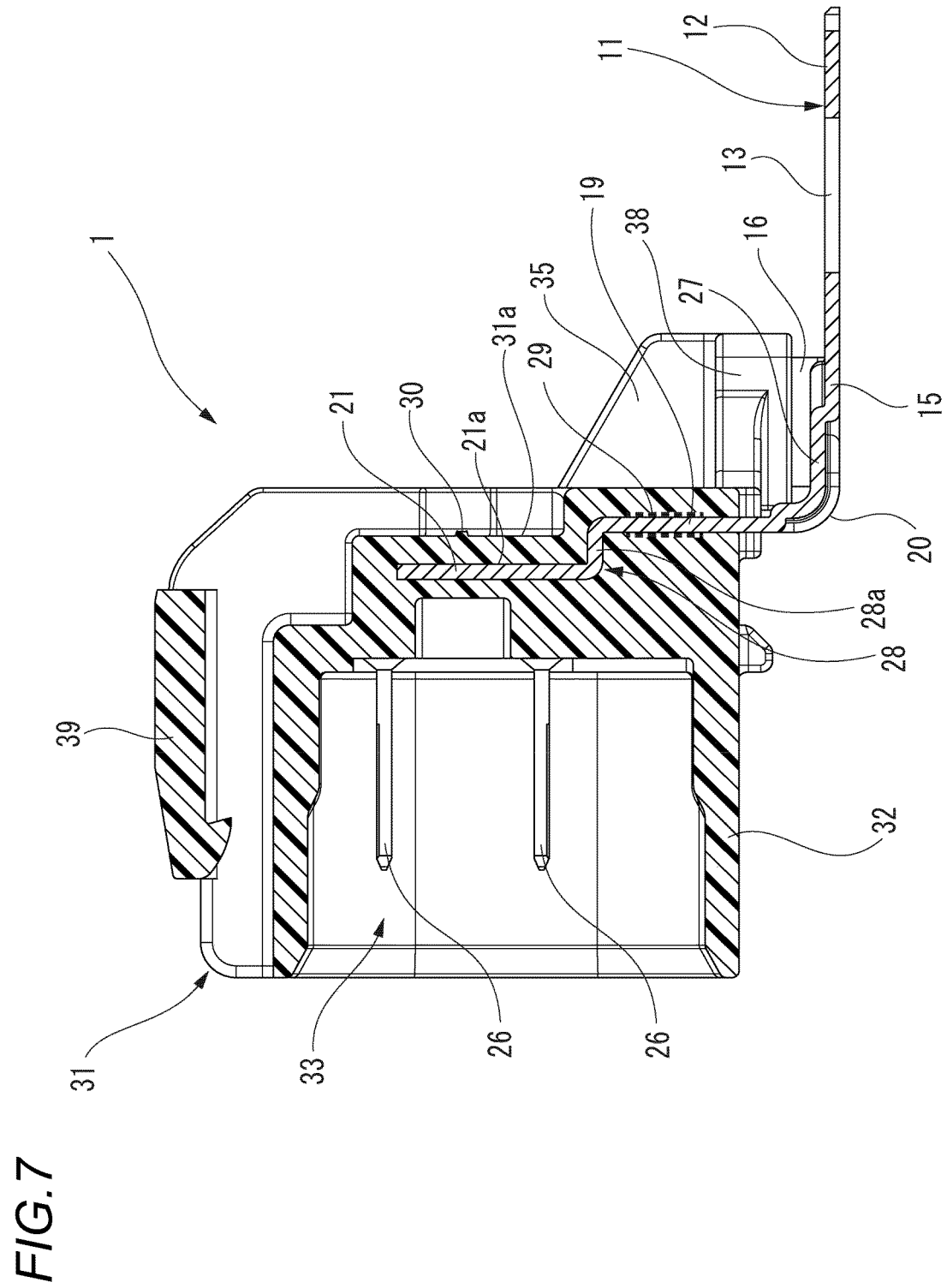
FIG. 7 is a sectional view taken along a line VII-VII of FIG. 4.

FIG. 3 is a perspective view of the joint connector shown 1 in FIG. 2 as viewed from the front side. FIG. 4 is a rear view of the joint connector 1 in which the ground terminal member 11 is insert-molded in the housing 31. FIG. 5 is a perspective view of the ground terminal member 11 as viewed from a rear upper side. FIG. 6 is a perspective view of the ground terminal member 11 as viewed from a front lower side. FIG. 7 is a sectional view taken along a line VII-VII of FIG. 4.

As shown in FIGS. 3 and 4, in the joint connector 1, the ground terminal member 11 is insert-molded in the housing 31.

As shown in FIGS. 5 and 6, the ground terminal member 11 is integrally formed with a plate-shaped fixing portion 12, a body horizontal plate portion 15 extending from the plate-shaped fixing portion 12, a body rising plate portion 19 extending from the body horizontal plate portion 15, a terminal connection portion 21 provided above the body rising plate portion 19, a crank-shaped bent portion 28 provided in the vicinity of the terminal connection portion 21 in the body rising plate portion 19, and coupling pieces 16 continuously provided on left and right side edges of the body horizontal plate portion 15 and protruding upward.

A bolt through hole 13 is formed in the plate-shaped fixing portion 12. The plate-shaped fixing portion 12 is screwed and fixed to a body 100, which is a ground portion of the vehicle, by fastening a stud bolt 71 inserted into the bolt through hole 13 to the body 100 with a nut 73. Thus, the ground terminal member 11 is grounded to the body 100. A rotation prevention piece 14 is formed in a part of the plate-shaped fixing portion 12. The rotation prevention piece 14 restricts, by engaging with a step or a hole portion around a ground surface to which the plate-shaped fixing portion 12 is screwed and fixed, rotation of the plate-shaped fixing portion 12 with respect to the ground surface.

A pair of coupling pieces 16 bent upward are continuously provided on the left and right edges of the body horizontal plate portion 15 extending forward from the plate-shaped fixing portion 12. The coupling pieces 16 are each formed with a through hole 18, which is a locking portion for increasing a coupling strength between the coupling pieces 16 and resin portions 38 of the housing 31 covering the coupling pieces 16.

The body rising plate portion 19 is formed by bending the body horizontal plate portion 15 at 90° in a rising direction at a bent portion 20. A bending angle of the bent portion 20 is not limited to 90°, and can be appropriately changed according to a shape around the ground surface to which the plate-shaped fixing portion 12 is screwed and fixed, and the fitting direction of the counterpart connector 51.

Further, the bent portion 20 is provided with an embossed portion 27 extending over the body horizontal plate portion 15 and the body rising plate portion 19.

The crank-shaped bent portion 28 bent in a crank shape along a plate thickness direction is formed in the vicinity of the terminal connection portion 21 in the body rising plate portion 19. The crank-shaped bent portion 28 can gain a creepage distance from the terminal connection portion 21 to the body horizontal plate portion 15 in the body rising plate portion 19.

Further, the primer treatment portion 29 is applied by coating or the like to the outer peripheral surface of the body rising plate portion 19 on the body horizontal plate portion 15 side with respect to the crank-shaped bent portion 28. As shown in FIG. 7, when the ground terminal member 11 is insert-molded in the housing 31, the primer treatment portion 29 can bring the resin of the housing 31 into close contact with the outer peripheral surface of the body rising plate portion 19.

At both left and right end portions of the terminal connection portion 21, folding plate portions 22 are continuously provided to the terminal connection portion 21 respectively, and the folding plate portion 22 folded forward is overlapped with the terminal connection portion 21.

Dowels 25 protruding toward the terminal connection portion 21 side are formed in the respective folding plate portions 22 by dowel processing. By fitting the dowels 25 into holes 24 formed in the terminal connection portion 21, the folding plate portions 22 are restricted from being displaced with respect to the terminal connection portion 21.

A plurality of terminal connecting portions 26 protrude in the same direction from upper and lower edges of the folding plate portion 22. In the ground terminal member 11, the plurality of terminal connecting portions 26 protruding forward in a plane perpendicular to a plane of the body rising plate portion 19 are arranged in two stages in the upper-lower direction.

As shown in FIGS. 3 and 4, in the housing 31 in which the ground terminal member 11 is insert-molded, a housing body portion 32 including the lock portion 39 and the fitting recessed portion 33 into which the counterpart fitting portion 53 of the counterpart housing 52 is fitted, and a pair of reinforcing rib portions 35 are integrally molded.

That is, in the housing body portion 32, the body rising plate portion 19 and the terminal connection portion 21 are insert-molded in a state in which the plurality of terminal connecting portions 26 protrude into the fitting recessed portion 33. Further, the pair of reinforcing rib portions 35 are integrally formed with the housing body portion 32 so as to connect the resin portions 38 covering the coupling pieces 16 and a resin portion 36 covering the terminal connection portion 21. The resin portions 38 covering the coupling pieces 16 flow into the through holes 18 of the coupling pieces 16 and solidifies, thereby increasing coupling strength with the coupling pieces 16.

As shown in FIGS. 4 and 7, the joint connector 1 has a gate mark 30, which is a trace filled with the molten resin of the housing 31 when the ground terminal member 11 is insert-molded, on a surface 31a of the housing 31 on a side opposite to a protruding direction of the terminal connecting portion 26 corresponding to the terminal connection portion 21.

Next, a case where the counterpart connector 51 is fitted to the joint connector 1 will be described.

Figure 8:
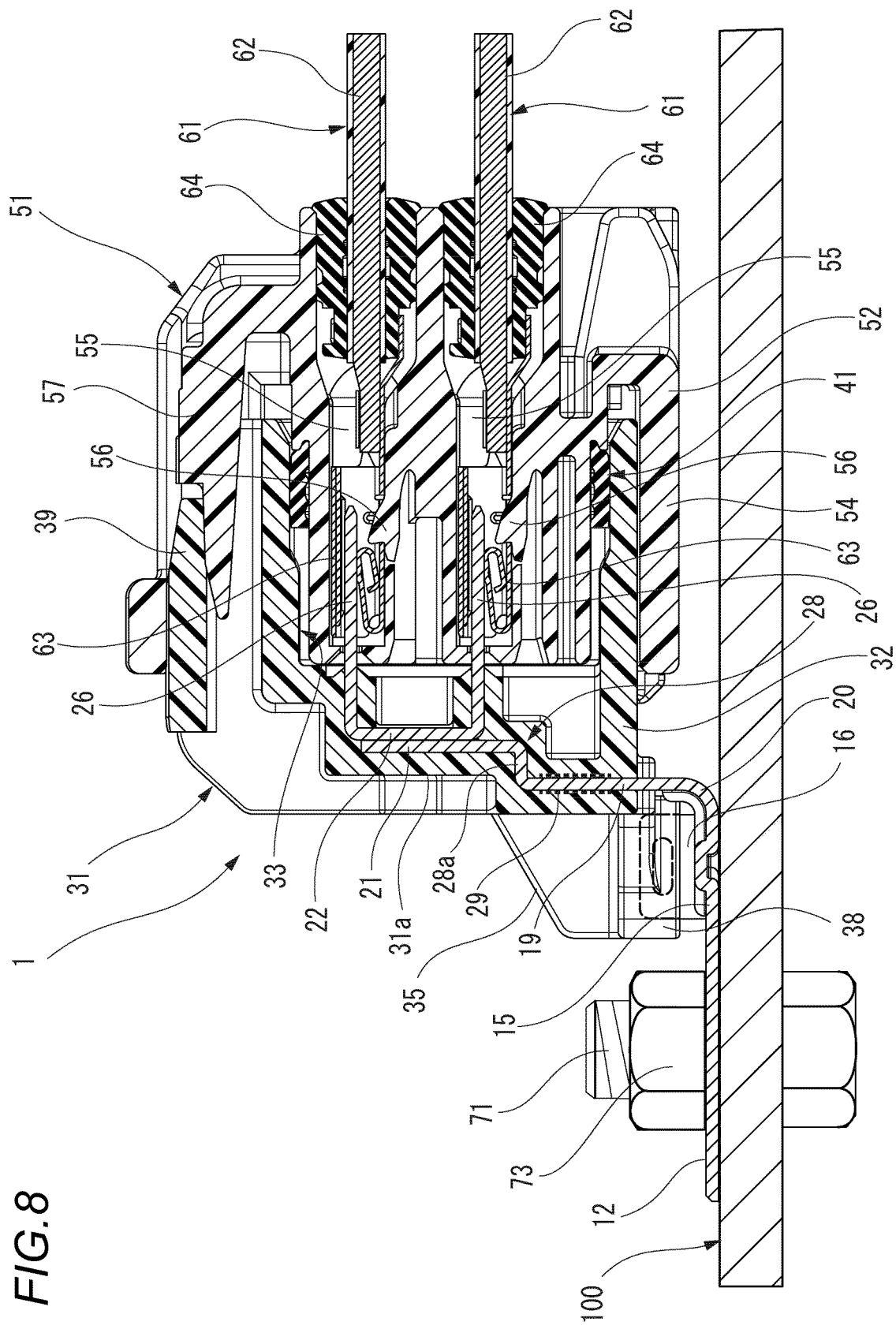
FIG. 8 is a longitudinal sectional view of the counterpart connector and the joint connector which is screwed and fixed to a ground portion of a vehicle.

FIG. 8 is a longitudinal sectional view of the counterpart connector 51 and the joint connector 1 which is screwed and fixed to the body 100 of the vehicle.

In order to fit the counterpart connector 51 to the joint connector 1 which is screwed and fixed to the body 100 of the vehicle, a front end of the counterpart housing 52 of the counterpart connector 51 is brought close to a front end of the housing 31 of the joint connector 1. Then, the counterpart fitting portion 53 of the counterpart housing 52 is inserted into the fitting recessed portion 33 of the housing 31.

Then, the terminal connecting portions 26 formed on the ground terminal member 11 of the joint connector 1 are conductively connected to the counterpart terminals 63 accommodated in the terminal accommodating chamber 55 of the counterpart housing 52, and the electric wires 62 are electrically connected to the ground terminal member 11. The electric wires 62 are also electrically connected to each other via the ground terminal member 11. In this state, the lock arm 57 locks the lock portion 39, and the housing 31 and the counterpart housing 52 are locked to each other in a state of being fitted.

Next, a case of manufacturing the joint connector 1 in which the ground terminal member 11 is integrated with the housing 31 by insert molding will be described.

Figure 9:
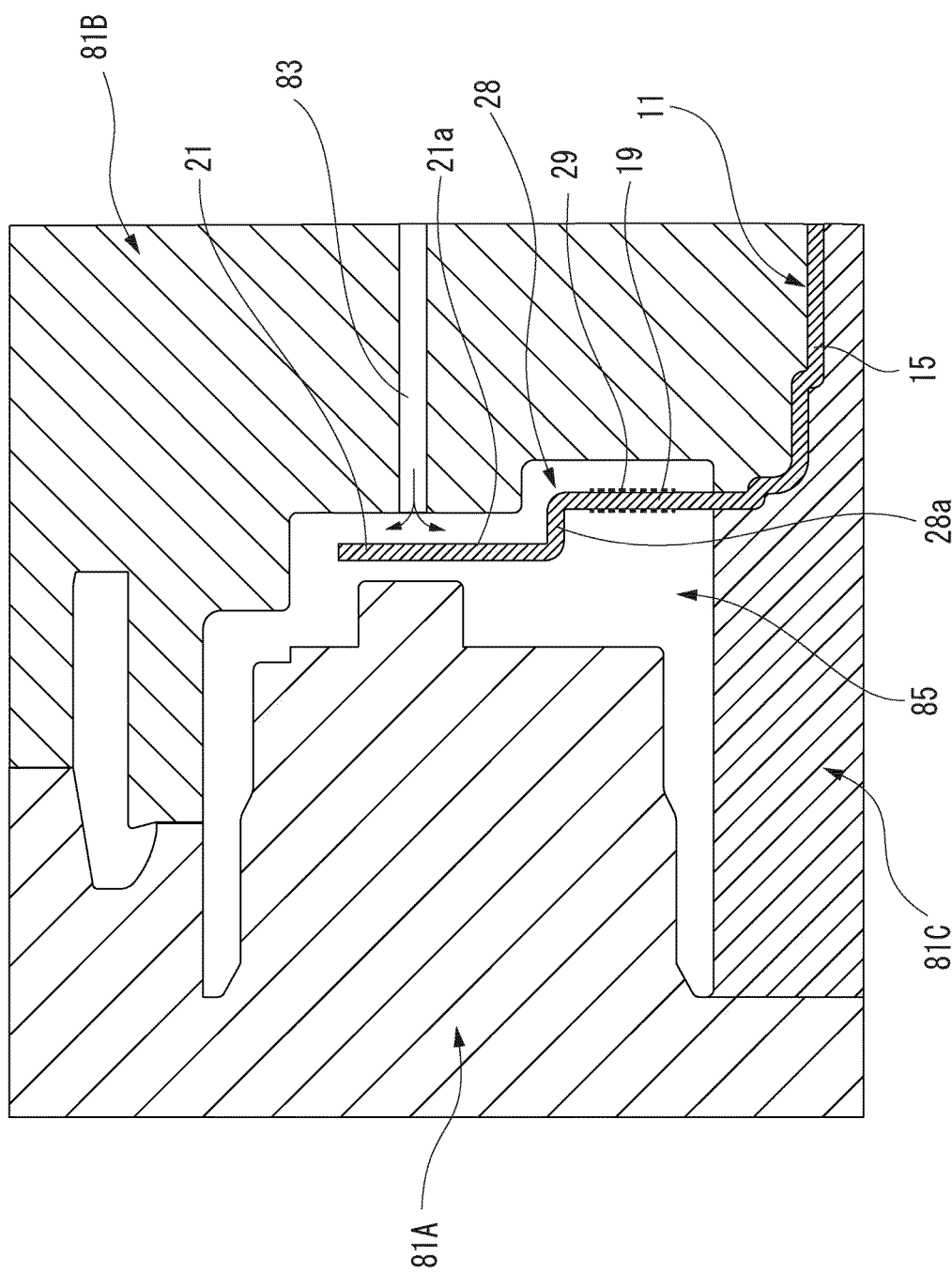
FIG. 9 is a schematic sectional view of a mold illustrating a method for manufacturing the joint connector according to the present embodiment.

FIG. 9 is a schematic sectional view of a mold illustrating a method for manufacturing the joint connector 1 according to the present embodiment.

As shown in FIG. 9, in order to manufacture the joint connector 1 by molding the housing 31 by insert molding, for example, molds 81A, 81B, and 81C are used. The mold 81A is a molding mold on the front side of the housing 31, the mold 81B is a molding mold on the rear side of the housing 31, and the mold 81C is a molding mold on a lower face side of the housing 31.

When the insert molding is performed by the molds 81A, 81B, and 81C, the ground terminal member 11 is held by the molds 81A, 81B, and 81C such that the body rising plate portion 19, the terminal connection portion 21, and the like of the ground terminal member 11 are disposed in a cavity 85 which is a molding space for molding the housing 31. In this state, a molten resin is injected from a gate 83 provided in the mold 81B. The gate 83 is provided at a position facing a surface 21a of the terminal connection portion 21 of the ground terminal member 11 on a side opposite to the protruding direction of the terminal connecting portions 26.

When the molten resin is injected from the gate 83 of the mold 81B, the molten resin hits the surface 21a of the terminal connection portion 21 on the side opposite to the protruding direction of the terminal connecting portions 26 and then spreads throughout the cavity 85, as indicated by arrows in FIG. 9. Specifically, the molten resin injected from the gate 83 flows up, down, left, and right on the surface 21a of the terminal connection portion 21, goes around to the protruding direction of the terminal connecting portions 26 in the body rising plate portion 19 and the terminal connection portion 21, and flows into the molding space of the housing body portion 32, the reinforcing rib portion 35, and the like.

Here, the crank-shaped bent portion 28 is provided in the vicinity of the terminal connection portion 21 in the body rising plate portion 19. By forming the crank-shaped bent portion 28, the creepage distance from the terminal connection portion 21 to the primer treatment portion 29 in the body rising plate portion 19 is extended, and momentum of the molten resin flowing downward on the surface 21a of the terminal connection portion 21 can be weakened until the molten resin reaches the primer treatment portion 29. Further, the molten resin flowing downward on the surface 21a of the terminal connection portion 21 hits a horizontal portion 28a of the crank-shaped bent portion 28, and reaches the primer treatment portion 29 applied to the outer peripheral surface of the body rising plate portion 19 in a state where the momentum is weakened.

That is, the molten resin injected from the gate 83 does not directly flow into the primer treatment portion 29, and the primer treatment portion 29 can be prevented from being peeled off from the outer peripheral surface of the body rising plate portion 19.

Further, for example, when a bending direction of the crank-shaped bent portion 28 is formed in the opposite direction, the outer peripheral surface of the body rising plate portion 19 to which the primer treatment portion 29 is applied is offset toward the protruding direction of the terminal connecting portion 26 with respect to the surface 21a of the terminal connection portion 21. Therefore, the molten resin flowing downward on the surface 21a of the terminal connection portion 21 hits an inner wall of the mold 81B, and reaches the primer treatment portion 29 applied to the outer peripheral surface of the body rising plate portion 19 in a state where the momentum is weakened. That is, the molten resin injected from the gate 83 does not directly flow into the primer treatment portion 29, and the primer treatment portion 29 can be prevented from being peeled off from the outer peripheral surface of the body rising plate portion 19.

Thereafter, when the resin filling the cavity 85 in the molds 81A, 81B, and 81C is cured, the molds 81A, 81B, and 81C are opened to release the joint connector 1. As a result, the joint connector 1 is obtained in which the ground terminal member 11 is insert-molded in and integrated with the housing 31.

Therefore, in the joint connector 1 and the method for manufacturing the joint connector 1 according to the present embodiment described above, when the ground terminal member 11 is insert-molded in the housing 31 to manufacture the joint connector 1, the molten resin injected from the gate 83 hits the terminal connection portion 21 disposed in the cavity 85, and then flows into the cavity 85. That is, the molten resin injected from the gate 83 hits the horizontal portion 28a of the crank-shaped bent portion 28, and reaches the primer treatment portion 29 applied to the outer peripheral surface of the body rising plate portion 19 in a state where the momentum is weakened.

Therefore, the molten resin injected from the gate 83 does not directly flow into the primer treatment portion 29, and the primer treatment portion 29 can be prevented from being peeled off from the outer peripheral surface of the body rising plate portion 19.

Therefore, in the joint connector 1 according to the present embodiment described above, the resin of the housing 31 in which the ground terminal member 11 is insert-molded and the outer peripheral surface of the body rising plate portion 19 in the ground terminal member 11 are reliably brought into close contact with each other by the primer treatment portion 29, and then a gap therebetween is prevented from being generated. Therefore, even when the joint connector 1 is used as a waterproof connector, it is possible to prevent water from entering the connector through a gap generated between the outer peripheral surface of the body rising plate portion 19 in the ground terminal member 11 and the resin of the housing 31.

Therefore, according to the joint connector 1 and the method for manufacturing the joint connector 1 of the present embodiment, it is possible to prevent water from entering the connector by preventing a gap from being generated between the resin of the housing 31 in which the ground terminal member 11 is insert-molded and the outer peripheral surface of the ground terminal member 11.

The present disclosure is not limited to the above-described embodiment, and can be appropriately modified, improved, or the like. In addition, the material, shape, size, number, arrangement position, and the like of components in the above-described embodiment are optional and are not limited as long as the present disclosure can be achieved.

The housing 31 of the above-described embodiment, includes, in the housing body portion 32, the fitting recessed portion 33 into which the counterpart fitting portion 53 of the counterpart housing 52 having the plurality of terminal accommodating chambers 55 each accommodating the counterpart terminal 63 is fitted. The terminal connecting portions 26 protruding into the fitting recessed portion 33 are electrically connected to the counterpart terminals 63 of the counterpart housing 52, but the present disclosure is not limited thereto. For example, the housing may include a terminal holding mechanism such as a locking lance or a retainer for holding the counterpart terminal 63 in the housing body portion, and the plurality of terminal connecting portions may be electrically connected to the counterpart terminal held by the terminal holding mechanism.

According to a first aspect of the present disclosure, a joint connector (1) includes: a ground terminal member (11) made of a conductive metal; a primer treatment portion (29) formed by applying a primer onto the ground terminal member (11); and a housing (31) to which the ground terminal member (11) is insert-molded. The ground terminal member (11) includes: a plate-shaped fixing portion (12) that is fixed to a ground portion (body 100) of a vehicle; a body horizontal plate portion (15) that extends from the plate-shaped fixing portion (12); a body rising plate portion (19) that is formed by bending the body horizontal plate portion (15) in a rising direction at a bent portion (20); a terminal connection portion (21) that is provided above the body rising plate portion (19) and that is formed with a plurality of terminal connecting portions (26) electrically connectable with a counterpart terminal (63); and a crank-shaped bent portion (28) that is bent in a crank shape in a vicinity of the terminal connection portion (21) in the body rising plate portion (19). The ground terminal member (11) is configured by integrally forming the plate-shaped fixing portion (12), the body horizontal plate portion (15), the body rising plate portion (19), the terminal connection portion (21), and the crank-shaped bent portion (28). The housing (31) has a gate mark (30) formed by filling a molten resin on a surface (31a) of the housing (31) on a side opposite to a direction in which the terminal connecting portions (26) protrude. The primer treatment portion (29) is applied to an outer peripheral surface of the body rising plate portion (19) on a side of the body horizontal plate portion (15) with respect to the crank-shaped bent portion (28).

According to a second aspect of the present disclosure, a method for manufacturing the joint connector (1) includes: holding the ground terminal member (11) in a mold (81A, 81B, 81C) for molding the housing (31); and molding the housing (31) by filling the mold (81A, 81B, 81C) with the molten resin from a gate (83) disposed at a position facing the terminal connection portion (21) in the mold (81A, 81B, 81C).

According to the joint connector (1) having the configuration of the first aspect and the method for manufacturing a joint connector having the configuration of the second aspect, when the ground terminal member (11) is insert-molded in the housing (31) to manufacture the joint connector (1), the molten resin injected from the gate (83) hits the terminal connection portion (21) disposed in the molds (81A, 81B, 81C), and then flows into the molds (81A, 81B, 81C).

By forming the crank-shaped bent portion (28), a creepage distance from the terminal connection portion (21) to the primer treatment portion (29) in the body rising plate portion (19) is extended, and momentum of the molten resin injected from the gate (83) can be weakened until the molten resin reaches the primer treatment portion (29). The molten resin injected from the gate (83) hits the horizontal portion (28a) of the crank-shaped bent portion (28) or an inner wall of the die (81B), and reaches the primer treatment portion (29) applied to the outer peripheral surface of the body rising plate portion (19) in a state where the momentum is weakened.

That is, the molten resin injected from the gate (83) does not directly flow into the primer treatment portion (29), and the primer treatment portion (29) can be prevented from being peeled off from the outer peripheral surface of the body rising plate portion (19).

Therefore, the resin of the housing (31) in which the ground terminal member (11) is insert-molded and the outer peripheral surface of the body rising plate portion (19) in the ground terminal member (11) are reliably brought into close contact with each other by the primer treatment portion (29), and a gap therebetween is prevented from being generated. Therefore, even when the joint connector (1) is used as a waterproof connector, it is possible to prevent water from entering the connector through a gap generated between the outer peripheral surface of the body rising plate portion (19) in the ground terminal member (11) and the resin of the housing (31).

According to the joint connector and the method for manufacturing the joint connector of the present disclosure, it is possible to prevent water from entering the connector by preventing a gap from being generated between the resin of the housing in which the ground terminal member is insert-molded and the outer peripheral surface of the ground terminal member.

What is claimed is:

1. A joint connector comprising:
    a ground terminal member made of a conductive metal;
    a primer treatment portion formed by applying a primer onto the ground terminal member; and
    a housing to which the ground terminal member is insert-molded, wherein
    the ground terminal member includes:
    a plate-shaped fixing portion that is fixed to a ground portion of a vehicle;
    a body horizontal plate portion that extends from the plate-shaped fixing portion;
    a body rising plate portion that is formed by bending the body horizontal plate portion in a rising direction at a bent portion;
    a terminal connection portion that is provided above the body rising plate portion and that is formed with a plurality of terminal connecting portions electrically connectable with a counterpart terminal; and
    a crank-shaped bent portion that is bent in a crank shape in a vicinity of the terminal connection portion in the body rising plate portion,
    the ground terminal member is configured by integrally forming the plate-shaped fixing portion, the body horizontal plate portion, the body rising plate portion, the terminal connection portion, and the crank-shaped bent portion,
    the housing has a gate mark formed by filling a molten resin on a surface of the housing on a side opposite to a direction in which the terminal connecting portions protrude, and
    the primer treatment portion is applied to an outer peripheral surface of the body rising plate portion on a side of the body horizontal plate portion with respect to the crank-shaped bent portion.

2. A method for manufacturing the joint connector according to claim 1, the method comprising:
    holding the ground terminal member in a mold for molding the housing; and
    molding the housing by filling the mold with the molten resin from a gate disposed at a position facing the terminal connection portion in the mold.

* * * * *